(12) United States Patent
Haq et al.

(10) Patent No.: US 9,880,473 B2
(45) Date of Patent: Jan. 30, 2018

(54) SURFACE TREATMENT METHOD FOR DIELECTRIC ANTI-REFLECTIVE COATING (DARC) TO SHRINK PHOTORESIST CRITICAL DIMENSION (CD)

(71) Applicant: Headway Technologies, Inc., Milpitas, CA (US)

(72) Inventors: Jesmin Haq, Milpitas, CA (US); Tom Zhong, Saratoga, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/189,296

(22) Filed: Jun. 22, 2016

(65) Prior Publication Data

US 2017/0371247 A1 Dec. 28, 2017

(51) Int. Cl.
| | | |
|---|---|---|
| *G03C 5/40* | (2006.01) | |
| *G03F 7/40* | (2006.01) | |
| *G03F 7/20* | (2006.01) | |
| *G03F 7/32* | (2006.01) | |

(52) U.S. Cl.
CPC ............ *G03F 7/405* (2013.01); *G03F 7/2053* (2013.01); *G03F 7/322* (2013.01)

(58) Field of Classification Search
USPC .................................................. 430/328, 331
See application file for complete search history.

(56) References Cited

U.S. PATENT DOCUMENTS

| | | | |
|---|---|---|---|
| 6,582,137 B1* | 6/2003 | Crabtree | ............... H01L 21/312 |
| | | | 118/52 |
| 7,351,936 B1* | 4/2008 | Chang | ................. F27B 17/0025 |
| | | | 118/724 |
| 7,630,053 B2 | 12/2009 | Kawamura | |
| 8,211,626 B2 | 7/2012 | Ahn et al. | |
| 2014/0256155 A1 | 9/2014 | Ting et al. | |
| 2016/0054658 A1 | 2/2016 | Yoshidome et al. | |

* cited by examiner

*Primary Examiner* — Daborah Chacko Davis
(74) *Attorney, Agent, or Firm* — Saile Ackerman LLC; Stephen B. Ackerman (57) ABSTRACT

A KrF (248 nm) photoresist patterning process flow is disclosed wherein photoresist patterns having a sub-100 nm CD are formed on a dielectric antireflective coating (DARC) thereby lowering cost of ownership by replacing a more expensive ArF (193 nm) photoresist patterning process. A key feature is treatment of a DARC such as SiON with a photoresist developer solution that is 0.263 N tetramethylammonium hydroxide (TMAH) prior to treatment with hexamethyldisilazane (HMDS) in order to significantly improve adhesion of features with CD down to about 60 nm. After the HMDS treatment, a photoresist layer is coated on the DARC, patternwise exposed, and treated with the photoresist developer solution to form a pattern therein. Features that were previously resolved by KrF patterning processes but subsequently collapsed because of poor adhesion, now remain upright and intact during a subsequent etch process used to transfer the sub-100 nm features into a substrate.

20 Claims, 5 Drawing Sheets

SURFACE TREATMENT METHOD FOR DIELECTRIC ANTI-REFLECTIVE COATING (DARC) TO SHRINK PHOTORESIST CRITICAL DIMENSION (CD)

TECHNICAL FIELD

The invention relates to a photoresist process that includes a photolithography exposure system and involves a method for improving photoresist adhesion to a DARC substrate such that photoresist image collapse is minimized below a critical dimension (CD) that is beyond the photolithography exposure system's typical limit thereby enabling a lower device production cost.

BACKGROUND

The continual reduction of semiconductor device dimensions has been driven by the economics of producing more circuits per chip and more chips per processed wafer as well as by the performance advantages of faster switching speeds and reduced power consumption resulting from smaller circuit components. One of the more common non-volatile memory storage devices utilized in the semiconductor and hard disk drive (HDD) industries is called a magnetic random access memory (MRAM) and variations thereof such as a spin transfer torque MRAM or STT-MRAM that incorporate a magnetic tunneling junction (MTJ) as a memory storage cell. A MRAM array is generally comprised of an array of parallel first conductive lines on a horizontal plane, an array of parallel second conductive lines on a second horizontal plane spaced above and formed in a direction perpendicular to the first conductive lines, and an MTJ formed at each location where a second conductive line crosses over a first conductive line. The MTJ is a stack of layers with a configuration wherein two ferromagnetic (FM) layers are separated by a thin non-magnetic insulating layer such as MgO, which is called a tunnel barrier layer. A first FM layer has a fixed magnetization direction (magnetic moment) while the magnetic moment of the second FM layer is able to be switched either parallel or anti-parallel to the first FM layer in order to establish "0" or "1" memory states.

In hard disk drives, a MTJ may be used in a magnetic read head or in a spintronic device such as a spin transfer oscillator (STO). Device density on a substrate is often referred to as area density capability (ADC), which is currently approaching 1 Terabit/square inch (Tbpsi) and expected to be 10 Tbpsi by 2025. Accordingly, MTJ critical dimension must be reduced to sub-100 nm in order to manufacture the aforementioned products. A diffraction limited optical exposure system is generally employed in a photolithography process to form a pattern of features in a photoresist mask layer (hereinafter referred to as photoresist layer) on a MTJ stack of layers. Then, an etching process is used to transfer openings in the photoresist layer through the MTJ stack of layers to generate a plurality of so-called MTJ nanopillars derived from the original pattern in the photoresist layer.

The resolvable feature size "L" in the photoresist pattern is expressed by the equation $L=K\lambda/NA$ where $\lambda$ is the wavelength output and NA is the numerical aperture of the optical exposure tool, and K is a constant that is process dependent and usually in the range of 0.6 to 0.8. Thus, both shorter $\lambda$ and larger NA are used to improve resolving power. However, NA has an upper limit of less than 1 because process latitude (depth of focus) decreases as NA increases. Moreover, lower $\lambda$ comes with a higher price for the optical exposure tool. The relative cost of ownership (COO) for the three most prevalent optical exposure tools for printing CDs below 500 nm are ArF (193 nm)>>KrF (248 nm)>i-line (365 nm). For advanced technologies, KrF exposure tools are often selected to print patterns with a CD from about 100 nm to 250 nm, and the more expensive ArF exposure tools are chosen to produce CDs of around 100 nm down to 45 nm or below. A substantial cost savings would be realized by converting the production of certain sub-100 nm devices from ArF to KrF optical exposure tools. In particular, the failure mode of KrF printed photoresist features is not always limited to lack of resolution (L) below 100 nm, but is often due to collapse of resolved features. In other words, the aspect ratio (t/CD) of photoresist layer thickness (t) to critical dimension may become too large to sustain adequate adhesion of features to a substrate during the photoresist pattern development process. As a result, features such as islands or parallel lines collapse or are completely swept away in the photoresist patterning process.

Another critical component of the photoresist patterning process is the anti-reflective coating (ARC) that is utilized as a sub-layer on which the photoresist layer is coated prior to exposure. The ARC serves to minimize reflectivity of light that passes through the photoresist layer and is reflected off a substrate during exposure. A uniform CD is required in the pattern printed throughout the photoresist layer. In the absence of an ARC, there is higher reflectivity in regions coated on metal features than in regions coated on dielectric layers that separate the metal features, and this condition causes non-uniform CDs in the MTJs across the chip. For example, portions of line patterns that pass over a metal substrate tend to have a smaller width (CD) than other portions that are not aligned over a reflective substrate, and this condition causes undesirable "notching" from a top-down view of the line pattern. Secondly, the ARC acts as an additional etch mask and has excellent etch resistance to the etch chemistry selected to transfer the photoresist pattern through at least an uppermost layer in the MTJ stack of layers. Accordingly, dielectric ARCs (DARCs) such as SiON are preferred over organic ARC polymers since the former have a lower etch rate in the aforementioned etch chemistry than organic materials, and this property helps to maintain the CD in the pattern during the etch transfer step.

Therefore, for KrF optical systems and processes to be viable in the manufacture of sub-100 nm devices, an improved KrF photoresist patterning process is needed that is compatible with DARCs in order to take advantage of a lower production cost associated with KrF technology compared with ArF optical exposure systems.

SUMMARY

One objective of the present invention is to provide a photoresist patterning process that is capable of forming sub-100 nm features on a DARC with a KrF optical exposure system.

A further objective of the present invention is to provide a photoresist patterning process according to the first objective that utilizes existing materials and process equipment.

According to one embodiment, these objectives are achieved with a process flow wherein a DARC such as SiON is deposited on a multilayer stack that has been formed on a wafer. According to a preferred embodiment, the uppermost layer in the multilayer stack is a hard mask that is selected for its etch resistance during a subsequent pattern transfer step. The remainder of the multilayer stack is a MTJ structure comprised of at least a free layer, a reference layer, and a tunnel barrier between the two aforementioned magnetic layers. A key feature is that a top surface of the DARC is treated with a photoresist developer solution that is 0.263N tetramethylammonium hydroxide (TMAH), for example. The photoresist developer solution may be applied in a developer station (module) similar to a well known process used during a subsequent step when a patternwise exposed photoresist layer is treated with the developer solution to form a photoresist pattern on the DARC. The total treatment time (residence time) of the wafer with the DARC top surface in the developer module is preferably from 30 to 240 seconds. The residence time may include a stationary period for forming a puddle of developer solution on the DARC, a DI water rinse, and a subsequent spinning motion. After the photoresist developer solution and DI water are spun off, hexamethyldisilane (HMDS) is applied to the DARC surface in another module that is connected to the same track system and is linked to the KrF optical exposure tool. Thereafter, a photoresist layer is coated on the DARC surface followed by a pre-bake, KrF patternwise exposure, post-exposure bake, and finally treatment with a photoresist developer solution to form a patterned photoresist layer. The photoresist pattern has a plurality of features having a CD, and the features are separated by openings which expose portions of the DARC top surface.

The photoresist layer may be a positive tone material wherein exposed regions are soluble in the developer solution and removed to leave openings between features (unexposed regions). In an alternative embodiment, the photoresist layer is a negative tone material in which exposed regions are insoluble in the developer solution and become features in the photoresist pattern. Unexposed regions are removed in the developer solution to provide openings in the photoresist layer thereby uncovering portions of the underlying DARC.

A conventional process sequence then follows in which a first etch step extends the openings in the photoresist pattern through the exposed (uncovered) portions of the DARC surface such that a sidewall of the photoresist layer at each opening is substantially coplanar with an underlying sidewall generated in the DARC. The features may be islands (oval or elliptical shapes). A second etch is performed to transfer the pattern in the DARC through the underlying hard mask. Finally, a third etch process is used to transfer the hard mask pattern through the underlying MTJ stack of layers to form a plurality of MTJ nanopillars or other structures.

In other embodiments, the features formed by the KrF patterning process are parallel lines, or other shapes such as circular islands (posts), or non-symmetrical line features. Improved adhesion of features with a critical dimension is observed because of the application of a photoresist developer solution to a DARC prior to HMDS treatment, and then coating the photoresist layer on the DARC.

In another embodiment, the KrF exposure tool is replaced by an i-line or g-line (405 nm) exposure tool in order to pattern a photoresist layer that is capable of being imaged by 365 nm and 405 nm wavelengths, respectively. In all embodiments, a significant cost savings is achieved by forming features with either a larger process window or with smaller feature size than previously realized with the photoresist patterning process and optical exposure tool. The improved patterning process is implemented with existing materials and process tools.

DETAILED DESCRIPTION

The present disclosure is a photoresist patterning process relating to an optical exposure system that is used to fabricate memory storage devices wherein a surface treatment of a DARC prior to photoresist coating and patternwise exposure is employed to substantially improve adhesion of the resulting features in the photoresist pattern to the DARC so that sub-100 nm feature sizes are reliably formed with KrF exposure. It should be understood that a plurality of features with a critical dimension (CD) are formed in a photoresist pattern in an array that has multiple rows and columns on a device chip that may involve non-volatile memory including MRAM and STT-MRAM, or thermally assisted magnetic recording (TAMR) applications that have a waveguide as a key component. However, the exemplary embodiments relate to only a limited number of features in order to simplify the drawings. The terms "pattern" and "image" may be used interchangeably.

Figure 1:
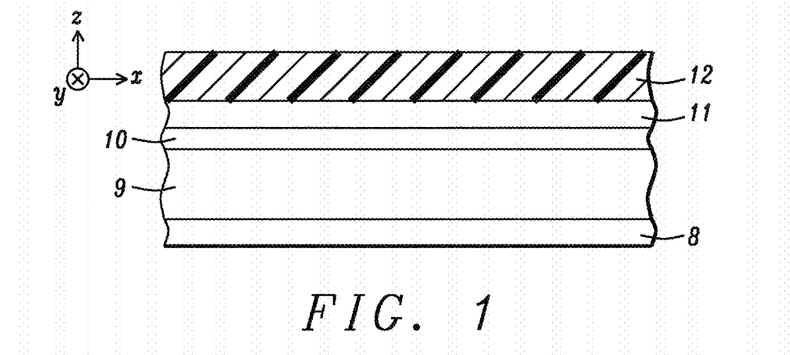
FIG. 1 is a cross-sectional view showing an uppermost photoresist layer and an underlying DARC formed on a stack of layers.

Referring to FIG. 1, a first step (101 in FIG. 7) in the photoresist patterning process of the present disclosure is deposition of a DARC 11 on a layer 10 that may be a multilayer structure. According to one embodiment, step 101 is a well known plasma enhanced chemical vapor deposition (PECVD) in a tool that is normally outside the optical exposure system. The components of the optical exposure system shown in FIG. 8 will be described in a later section. In the exemplary embodiment, layers 9, 10 form a MTJ stack of layers and are disposed on a substrate 8. According to one embodiment, layer 10 is a hard mask such as Ta, MnPt, TaN, or TiN, and layer 9 comprises a free layer, reference layer, and a tunnel barrier between the aforementioned two magnetic layers. The substrate may comprise a structure in which an uppermost layer has a plurality of conductive lines (not shown) formed within a dielectric layer. In an alternative embodiment, layer 9 may be a waveguide layer and the substrate 8 is a cladding layer made of a dielectric material in a partially formed write head. Typically, the substrate is formed on a wafer (not shown) that is transported through various manufacturing tools until all layers in the final device are fabricated. Then the wafer is diced into a plurality of individual chips each representing a MRAM or STT-MRAM, or a combined read/write head, for example.

In a preferred embodiment, DARC 11 is $SiO_rN_s$ where r and s are selected to tune the real part of the refractive index "n" and extinction coefficient "k" for the DARC such that reflectivity of light that is used to patternwise expose an overlying photoresist layer 12 in a subsequent step is minimized to improve CD control of the developed pattern. Moreover, the thickness of the DARC may be adjusted to minimize reflectance off the substrate. In other embodiments, SiCOH or SiN may be employed as the DARC and are deposited on layer 10 by a chemical vapor deposition (CVD) or PECVD process.

Figure 7:
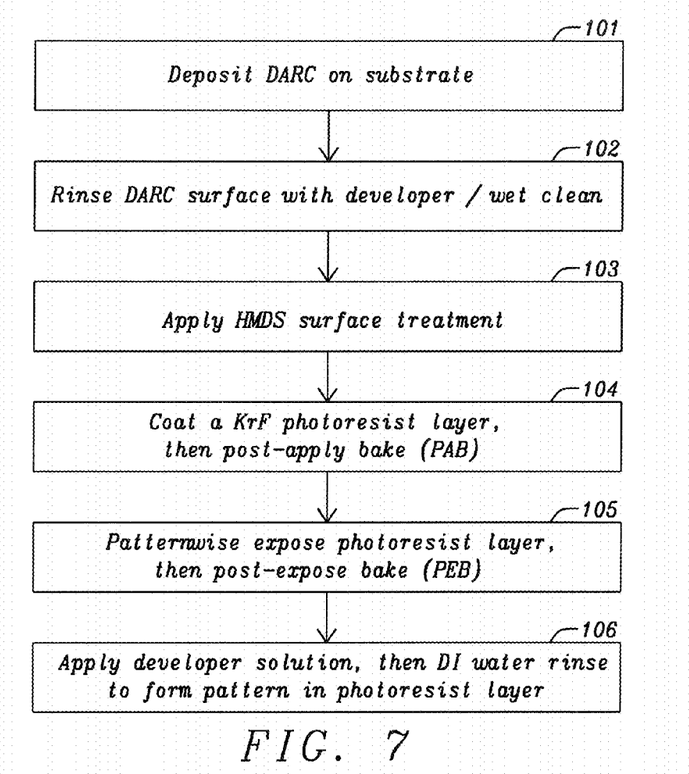
FIG. 7 is a process flow diagram showing a sequence of steps that are used to form a photoresist pattern according to an embodiment of the present disclosure.
Figure 8:
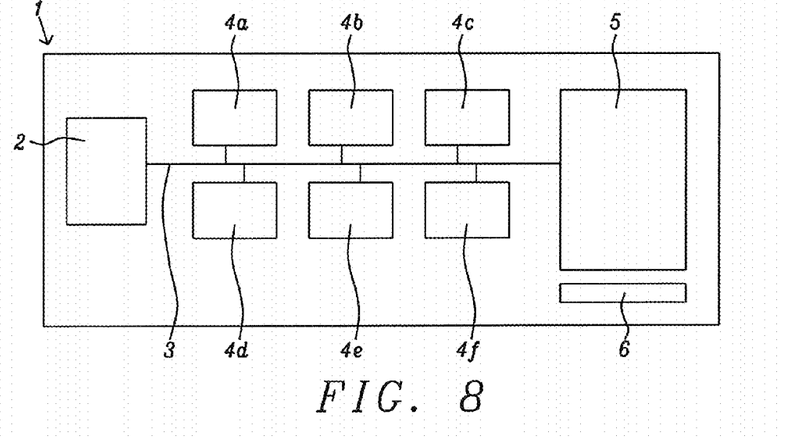
FIG. 8 is a diagram showing a top-down view of an optical exposure system including a controller station, and stations for loading/unloading wafers, coating photoresist on a wafer, baking, applying photoresist developer solution, applying HMDS, and exposing wafers.

Thereafter, a photoresist patterning process sequence 102-106 is performed within optical exposure system 1 illustrated in FIG. 8. A key feature of the process is step 102 that is employed to treat the top surface of DARC 11 prior to coating photoresist layer 12. According to one embodiment, the optical exposure system includes a loading/unloading station 2 where boats of wafers are inserted and removed. There is a controller 6 that monitors and controls the processes performed in each of the stations. A track system 3 includes a handler (not shown) that travels along the track to move a wafer from one station to the next. Stations 4a-4f include at least one coating station where photoresist layer 12 is formed on DARC 11, at least two bake stations that are hot plates required to bake the photoresist layer prior to (pre-bake) and following (post-expose bake) the patternwise exposure in the KrF optical exposure module 5, a station (module) to apply HMDS, and at least one developer station where the top surface of DARC 11 is treated, and where a patternwise exposed photoresist layer is treated following the post-expose bake to form a pattern. In an alternative embodiment, photoresist developer solution is applied to the DARC top surface in one developer station, and photoresist developer solution is applied to the patternwise exposed photoresist layer in a second developer station.

The developer station has a mechanism such as one or more nozzles that not only apply a photoresist developer solution for a pre-determined length of time according to a recipe programmed into the controller 2, but also direct a deionized water solution to rinse the wafer after the developer solution is spun off. Each of the coating and developer stations has a chuck to hold the wafer while the photoresist layer is being processed, and a bowl to collect liquid that is spun off during the photoresist coating and photoresist developer application processes. In addition, a dome shaped lid is typically lowered over the wafer during processing at each station 4a-4f, and is connected to an exhaust system to remove vapors that are expelled during coating, baking, or application of developer solution or HMDS. In other embodiments, more than six stations may be included in the optical exposure system.

According to one embodiment, step 102 (FIG. 7) comprises treatment of top surface 11t of the DARC with a photoresist developer solution that is an aqueous base solution such as commercially available 0.263 N TMAH from photoresist suppliers including Dow, JSR Microelectronics, and Tokyo Ohka Kogyo (TOK) America. This step is preferably performed in a developer station that is one of the stations 4a-4f. Step 102 comprises a residence time of 30 to 240 seconds for a wafer with the DARC top surface in the developer station. The residence time may include a stationary period when a puddle of developer solution is formed on the DARC top surface, and a subsequent period when the wafer is typically spun at speeds from 500 to 3000 rpm. DI water is also used to rinse the wafer after essentially all of the 0.263 N TMAH solution is spun off the wafer. Preferably, the wafer is spun at 500 to 3000 rpm for a period of 30 to 120 seconds while the DI water is applied to the DARC surface. Although not bound by theory, the photoresist developer surface treatment is believed to affect the contact angle or hydrophobicity of the DARC surface thereby resulting in improved adhesion of the subsequently formed photoresist layer 12.

Next, in step 103, HMDS is applied to a top surface of the DARC 11 in one of the stations 4a-4f in FIG. 8. In one embodiment, the HMDS is introduced for a period of 30 to 180 seconds as a vapor at a temperature from 120° C. to 150° C. in a station that preferably includes a dome shaped lid. The lid is lowered to form an enclosure over the wafer on the chuck and contain the vapor therein during this step. HMDS is a secondary component of the adhesion improvement sequence of the present disclosure as explained later. Step 102 is considered to be the most important contributor for achieving a stable photoresist pattern with sub-100 nm feature sizes at the conclusion of the photoresist patterning process flow at step 106 in KrF optical exposure system 1.

In step 104, a commercially available photoresist solution is spin coated on a top surface of DARC 11 on a wafer in a coating station (one of 4a-4f in FIG. 8). Then, the wafer is transported along the track system 3 to a baking station (another one of 4a-4f) to remove a substantial portion of the photoresist solvent and form photoresist layer 12. This bake is often referred to as a post-apply bake (PAB). The photoresist solution that is spin coated on the DARC preferably has one or more solvents that are combustible, not flammable, and evaporate during the PAB to provide a uniform top surface on the photoresist layer.

In the preferred embodiment, the photoresist layer is designed such that a chemical reaction is triggered by exposure to KrF (248 nm wavelength). Normally, the photoresist layer has multiple components including at least one solvent to solubilize all components during application to the wafer, and a polymer that is a poly(vinylphenol) or the like, or a derivative thereof wherein a protecting group is attached to the phenol moiety and is removed when a strong acid is produced from the photoacid generator (PAG) component in exposed regions. In unexposed regions of the photoresist layer, the PAG remains intact and there is no chemical change in any of the components. There are typically other components such as a surfactant to improve film coating uniformity, a trace amount of base additive to limit diffusion of photogenerated acid from exposed regions into unexposed regions, and other monomers or polymers to improve coating and imaging performance.

Following the PAB in step 104, the wafer is moved into the KrF exposure tool (station 5) and is patternwise exposed in step 105. Patternwise exposure of the photoresist layer generates acid in exposed regions that are determined by light transmission through transparent regions in a quartz mask placed between the KrF exposure source and the wafer. The mask also has opaque regions made of chrome or other materials that block 100% or a substantial portion of light output from the KrF exposure source. The layout of the opaque mask regions is the pattern that is transferred into the photoresist layer during exposure. Generally, the light pattern that is incident on the photoresist layer 12 (FIG. 1) during the exposure step is around ⅕ to ​⅒ the size of the pattern on the mask because of a focusing aspect during light transmission.

The KrF exposure tool may operate in a step-and-repeat manner in which the incident light pattern is directed to only a portion of the photoresist layer before the wafer is moved slightly on a platform to allow exposure of another portion of the photoresist layer. The step-and-repeat motion is usually performed multiple times per wafer in order to expose essentially the entire photoresist surface on the wafer. Once the KrF exposure is completed, the wafer is moved to one of the stations 4a-4f to perform another bake called a post-expose bake (PEB) wherein the chemical reaction catalyzed by the photogenerated acid in the photoresist layer is expedited by applying heat in the range of about 80° C. to 120° C. for a period up to about 2 minutes on a hot plate. Time and temperature are adjusted to achieve a desired throughput in the KrF optical exposure system 1 that is usually measured in wafers/hour. In some embodiments, depending on the stability and reactivity of the photoresist layer components, lower or higher PEB temperatures may be employed than mentioned above.

After the PEB, step 106 (FIG. 7) is performed wherein the wafer is transported to a developer station that is one of 4a-4f in FIG. 8. A photoresist developer solution such as 0.263 N TMAH is applied to remove base soluble regions of the photoresist layer 12 and then a DI water rinse is applied to the wafer in the same developer station to generate a pattern shown by the cross-sectional view in FIG. 2a, for example. In the exemplary embodiment, four photoresist features 12a-12d each having a CD "w", thickness "t", and sidewall 12s are separated by openings 13a-13c that expose portions 11t of the DARC top surface. Aspect ratio is defined as t/w and may be 4:1 or larger depending on the desired CD and photoresist thickness required to remain after a subsequent etch process transfers the photoresist pattern through the underlying DARC 11.

In the prior art, when the CD w is about 100 nm or below, the aspect ratio becomes too large for features 12a-12d to be printed in the photoresist by a KrF exposure system. In other words, the photoresist features are either unresolved, or are resolved but collapse because of inadequate adhesion to the DARC (or another ARC) as depicted by features 12a'-12d' in FIG. 3. Some of the features collapse and lean toward each other while other features (not shown) delaminate and are swept away by photoresist developer solution or during a subsequent DI water rinse. However, by using the process flow 101-106 of the present disclosure, we find that sub-100 nm features are patterned with improved adhesion following KrF exposure. Furthermore, a pattern comprising features 12a-12d in FIGS. 2a-2c has a large enough aspect ratio to enable pattern transfer into the DARC 11 during a subsequent etch step.

Figure 2A:
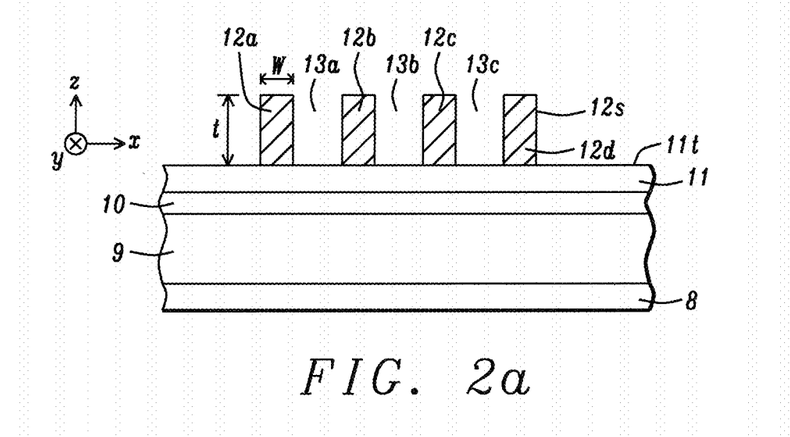
FIG. 2a is a cross-sectional view of the multilayer stack in FIG. 1 after the photoresist layer has been patternwise exposed and subjected to a photoresist developer solution to form a pattern.
Figure 2B:
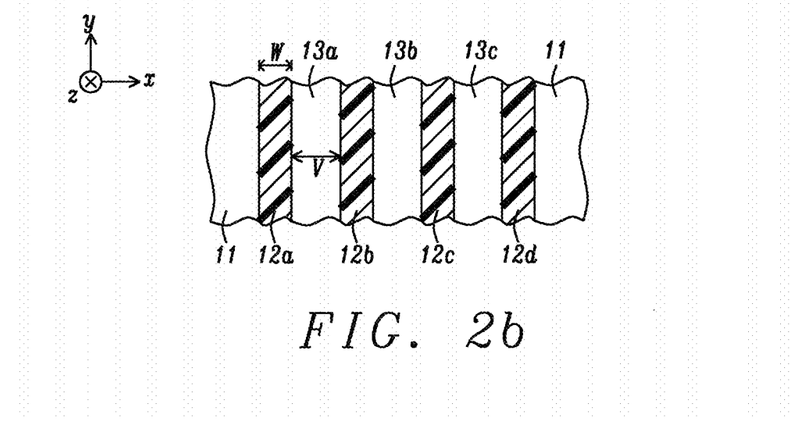
FIG. 2b is a top-down view of FIG. 2a wherein the photoresist pattern comprises parallel lines according to an embodiment of the present disclosure.
Figure 3:
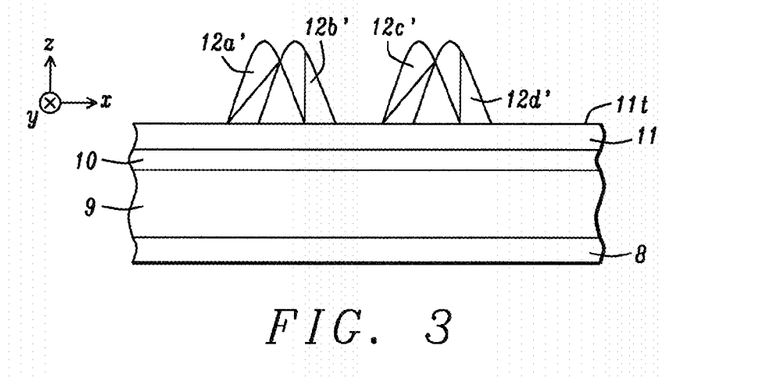
FIG. 3 is a cross-sectional view showing a failure mode of photoresist patterning that involves photoresist image collapse due to a high aspect ratio.

According to one embodiment depicted in FIG. 2b wherein parallel lines separated by spaces having width "v" are shown in a top-down view of the pattern in FIG. 2a, the photoresist layer 12 is preferably comprised of a positive tone material wherein a polymer has a phenol group or the like that is protected with a functional group that renders the polymer insoluble in photoresist developer solution. Thus, line features 12a-12d represent unexposed regions that remain insoluble in the developer solution in step 106. Portions of DARC 11 are visible in regions that were uncovered in step 106. Openings 13a-13c were formed where the protecting group on the polymer in the photoresist layer reacted with photogenerated acid from the PAG to form a base soluble phenol moiety or the like that was soluble in (and removed by) the developer solution.

Figure 2C:
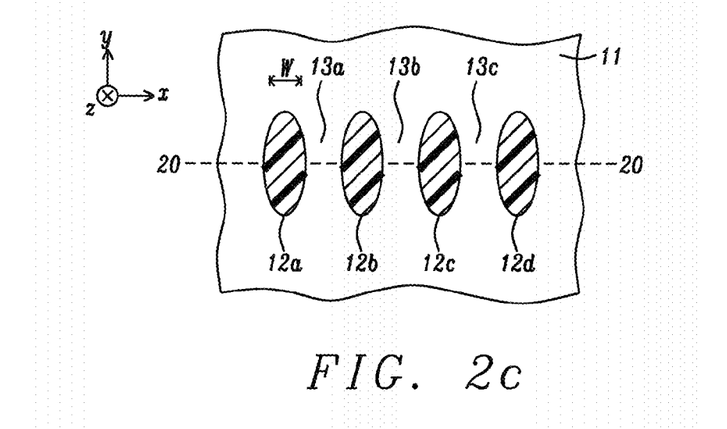
FIG. 2c is a top-down view of FIG. 2a wherein the photoresist pattern comprises island shapes according to an embodiment of the present disclosure.

In another embodiment shown in FIG. 2c, features 12a-12d may have oval shapes representing islands of a photoresist layer 12 comprising negative tone materials that were cross-linked during the exposure step 105 and thereby became insoluble in the developer solution applied in step 106. For example, photoresist layer 12 may contain a poly(vinylphenol) or the like that is aqueous base soluble, a PAG, and a crosslinkable monomer such as tetrahydroxymethylglycoluril (TMMGU) or another crosslinker with acid sensitive moieties that are removed by reacting with photogenerated acid in exposed regions. Thus, one or more groups are removed from the crosslinker to form reactive intermediates, which then react with hydroxyl groups on the polymer to form multiple cross-links that render the exposed regions insoluble in the photoresist developer. For negative tone materials, the photoresist developer solution may have a concentration less than 0.263 N. Note that the cross-sectional view in FIG. 2a is taken along plane 20-20 in FIG. 2c.

In other embodiments, a positive tone material may be selected for photoresist layer 12 to produce oval shapes 12a-12d. However, certain oval patterns have a larger process window (greater depth of focus and/or enhanced exposure latitude to maintain a certain CD) when made of a negative tone material. As appreciated by those skilled in the art, less process rework and higher product yield occurs with processes having a larger process window. In all embodiments, the photoresist developer solution employed in step 106 may have a concentration less than 0.263 N. Preferably, the photoresist developer solution used in step 102 is the same as in step 106 to minimize the number of chemicals required in the optical exposure system 1.

It should be understood that the present disclosure is not limited to the oval and line shapes shown in FIGS. 2a-2c. Other patterns such as circular islands (posts), and unsymmetrical island or line shapes and combinations thereof may be formed by the process flow of steps 101-106 as appreciated by those familiar with KrF technology. Moreover, line patterns may be formed in the same photoresist layer with small holes including via openings and trenches. In addition, some of the features may have a different CD than other features in the photoresist pattern. For example, one or more of features 12b-12d may have a CD greater or smaller than w in feature 12a. Likewise, one or both of the openings 13b or 13c may have a different width "v" than opening 13a.

Once the process sequence comprised of steps 102-106 is completed in the optical exposure system 1 in FIG. 8, the processed wafers are removed through loading/unloading station 2 and are transported to an etching tool where the photoresist pattern is transferred through one or more underlying layers.

Figure 4:
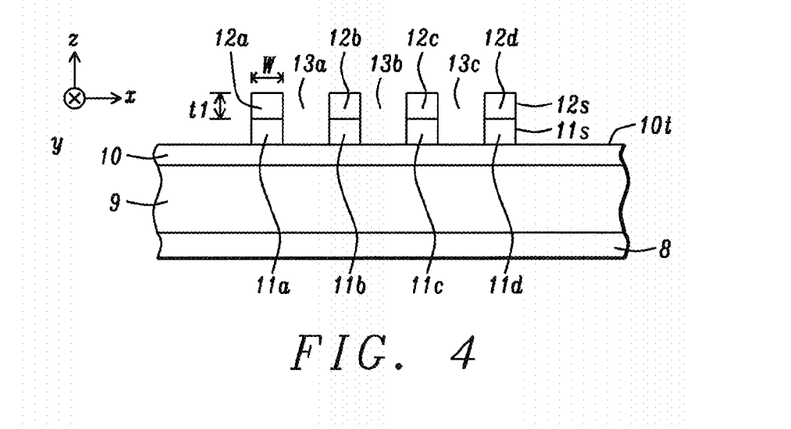
FIG. 4 is a cross-sectional view that shows the multilayer stack in FIG. 2a after a first etch step transfers the photoresist pattern through the DARC according to an embodiment of the present disclosure.

Referring to FIG. 4, the photoresist pattern shown in FIG. 2a is transferred through DARC 11 by a first etch process in a reactive ion etch (RIE) tool comprising a fluorocarbon gas such as $CF_4$, $CHF_3$, or $C_2F_4$ with a flow rate of about 50 standard cubic centimeters per minute (sccm) for 30 to 240 seconds, and a power of 500 to 1800 Watts according to an embodiment of the present disclosure. An etch gas chemistry is selected so that exposed DARC regions not covered by the photoresist layer are removed down to layer 10 while a substantial portion of features 12a-12d remain as an etch mask to ensure the CD "w" is transferred into the underlying DARC features. Preferably, width "w" of features 12a-12d is essentially duplicated in DARC features 11a-11d that are formed after the first etch process stops on a top surface 10t of hard mask 10. As a result, each of the features 11a-11d has a sidewall 11s that is coplanar with a sidewall 12s on features 12a-12d, respectively. During the first etch process, a certain amount of photoresist thickness is typically lost. As a result, a final thickness t1 after the first etch is generally less than starting thickness t. At this point, the photoresist layer including features 12a-12d may be stripped by a conventional method since DARC features 11a-11d will serve as an etch mask for the second etch process.

Figure 5:
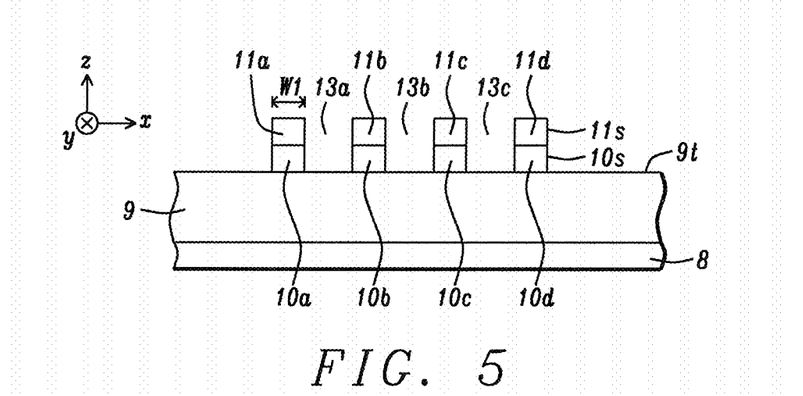
FIG. 5 is a cross-sectional view that shows the multilayer stack in FIG. 4 after a second etch step extends the pattern in the DARC through a hard mask layer according to an embodiment of the present disclosure.

Referring to FIG. 5, a second etch process in a RIE tool is performed to transfer the pattern comprised of features 11a-11d separated by openings 13a-13c through exposed regions of top surface 10t. The second etch preferably stops on a top surface 9t of the MTJ stack of layers 9 thereby forming hard mask features 10a-10d below features 11a-11d, respectively. Openings 13a-13c now extend from a top surface of features 11a-11d to top surface 9t. As a result, sidewalls 10s on the hard mask features are formed coplanar with sidewalls 11s on overlying DARC features, and each feature has a width w1. In some embodiments, w1=w. In other embodiments, material may be etched away from the sidewalls 10s, 11s during the second etch to make w1<w, or etched material is deposited on the aforementioned sidewalls so that w1>w.

The second RIE preferably comprises halogen based or $CH_3OH$ gas with a flow of around 15 sccm for a period of 30 to 240 seconds, and a power of 500 to 1800 Watts. The etch chemistry is selected so that a substantial portion of features 11a-11d remain after the second etch process is completed to ensure the CD "w1" is substantially the same as CD "w" in the original photoresist pattern.

Figure 6:
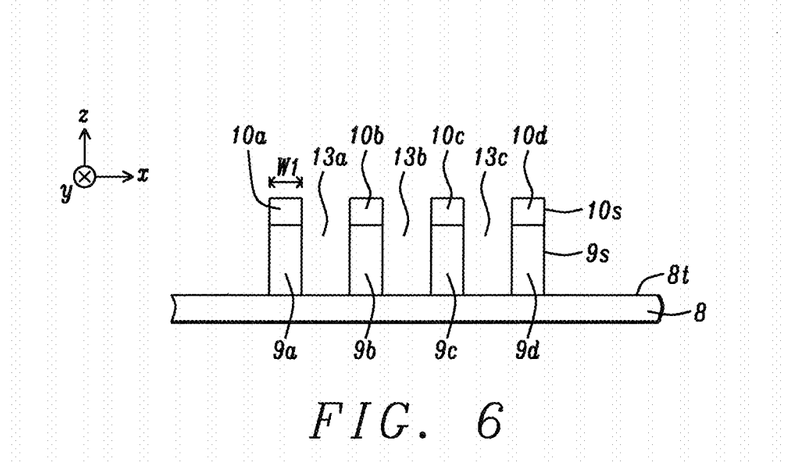
FIG. 6 is a cross-sectional view that shows the multilayer stack in FIG. 5 after the pattern in the hard mask layer is etch transferred through a MTJ structure according to an embodiment of the present disclosure.

Referring to FIG. 6, a third etch process is performed in a RIE tool according to a preferred embodiment of the present disclosure. The third RIE process transfers the pattern of hard mask features 10a-10d through the MTJ stack of layers and stops on top surface 8t of the substrate. The third etch process may comprise multiple steps each with a different etch chemistry since the third etch process is used to remove a variety of materials including portions of magnetic layers, non-magnetic metal layers, and at least one dielectric layer (tunnel barrier) each having a different etch rate in an etching chemistry selected for an overlying or underlying layer. Typically, DARC features 11a-11d are completely removed by one or more of the etch chemistries included in the third etch process.

As a result, sidewalls 9s are formed in the MTJ stack and preferably are coplanar with overlying sidewalls 10s. Accordingly, each of the stacks 9a/10a, 9b/10b, 9c/10c, 9d/10d is considered a MTJ nanopillar in a preferred embodiment wherein photoresist shapes 12a-12d are oval or circular features from a top-down view. In other embodiments, each one of the aforementioned stacks may represent a portion of a waveguide/cladding layer structure with critical dimension "w1" in a rectangular shape representing an end of the waveguide formed adjacent to an eventual air bearing surface (ABS). At this point, the etch transfer of the original photoresist pattern through the MTJ stack (or waveguide stack) of layers is complete. Thereafter, a conventional process flow is followed to build additional layers on the MTJ nanopillars in a read head, or on the waveguide stack in a write head. For example, a dielectric layer (not shown) may be deposited to fill the openings 13a-13c to a level that covers features 10a-10d. Then a chemical mechanical polish (CMP) process is performed to form a top surface on the dielectric layer that is coplanar with top surfaces of features 10a-10d.

The present disclosure also encompasses an embodiment wherein the process flow 101-106 is performed as indicated in FIG. 7 except the KrF exposure tool is replaced by an i-line exposure tool, and one or more of the components in photoresist layer 12 may be replaced by materials that are more compatible with i-line wavelengths that are centered at 365 nm. In this case, patterns with sub-100 nm features are not formed because the resolvable feature size "L" is not possible because of the larger exposure wavelength. However, adhesion of sub-500 nm images is improved such that process latitude for certain CDs above 100 nm is enhanced to the extent that i-line optical exposure processes are able to replace more expensive KrF optical exposure processes thereby realizing a considerable cost savings.

Figure 9:
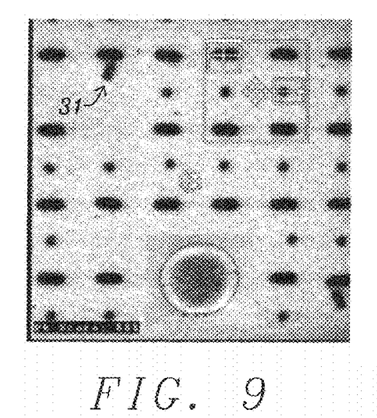
FIG. 9 and FIG. 10 are top-down views of scanning electron microscope (SEM) images of KrF patterns wherein certain features have collapsed after a process flow according to a prior art photoresist patterning method.

To illustrate the advantages of incorporating a process flow of the present disclosure in a KrF photoresist patterning scheme, an experiment was performed to compare KrF patterning capability on SiON surfaces subjected to different treatments before the photoresist layer is coated thereon. As a first reference example, a 300-350 nm thick film of SiON where n=2.15±0.02 and k=0.55±0.03 was deposited on a stack of MTJ layers on a wafer. With no further treatment, a 180 nm thick film of PEK500-A20 KrF photoresist from Sumika Electronic Materials, Inc. was coated on the SiON layer, and pre-baked at 110° C. for 60 seconds before patternwise exposure on an ASML PAS 5500 KrF exposure tool through a mask that is designed to print a series of oval shaped islands with feature sizes from about 60 nm to over 130 nm. The patternwise exposed wafer was post-expose baked at 120° C. for 60 seconds, and then developed with 0.263 N TMAH solution for 47 seconds followed by a DI water rinse. FIG. 9 shows a top-down view of an SEM image following the development in 0.263 N TMAH to form the intended KrF photoresist pattern. Note that some ovals 31, 32 with a 130 nm CD have delaminated and are seen as debris in other regions of the pattern. In the remaining features, the photoresist sidewall appears to be aligned substantially vertical to the substrate, which indicates an optimum depth of focus setting during the exposure step. Thus, we conclude the 130 nm features were resolved but several ovals delaminated because of poor adhesion to SiON.

Figure 10:
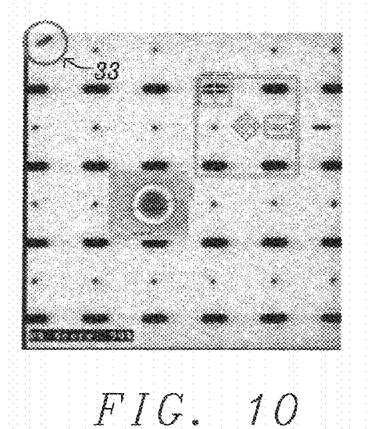

In another experiment that serves as a second reference, the same process flow as outlined previously with regard to FIG. 9 was followed except the SiON layer was treated with HMDS prior to coating the KrF photoresist layer. The HMDS was applied as a vapor in a module using the following conditions: 600 Hectopascal (hpa) pressure, temperature=135° C., and process time of 60 seconds. After photoresist exposure, PEB, and development, improved adhesion was observed since there was no delamination of 130 nm features. However, some resolved features with a CD around 85 nm did collapse as depicted in circle 33 in FIG. 10. Therefore, adhesion must be further improved in order for a KrF patterning process to be acceptable to reliably manufacture sub-100 nm features.

In a final experiment performed according to an embodiment of the present disclosure, we successfully demonstrated that sub-100 nm features could be resolved with good adhesion. The same process flow as described with respect to FIG. 10 was followed except an additional step (step 102 in FIG. 7) was included. In particular, the SiON surface was treated while the wafer was on a wafer chuck in a developer station within the KrF optical system represented in FIG. 8. The SiON surface was treated with a 0.263 N TMAH developer solution with a process comprising applying the developer solution for 10 seconds and a total developer treatment time of 37 seconds. Thereafter, a stream of DI water is directed at the wafer surface for 32 seconds while spinning to rinse the top surface for a total residence time of 69 seconds of the wafer in the developer module.

Figure 11:
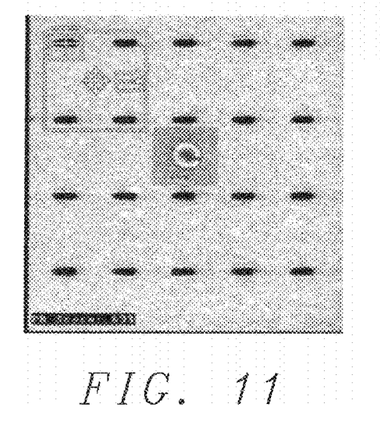
FIG. 11 is a top-down SEM image of sub-100 nm features that have been successfully patterned without image collapse following a KrF process sequence according to an embodiment of the present disclosure.

As mentioned previously, it is believed that the contact angle or hydrophobicity of the SiON surface is modified such that adhesion to a subsequent applied photoresist layer is improved. As shown in FIG. 11, the surprising result is that photoresist features sizes down to 60 nm and even at approximately 55 nm are resolved and still standing with excellent adhesion. Accordingly, KrF photoresist patterning schemes may now be applied to manufacture advanced memory products and other devices with sub-100 nm CD thereby substantially lowering device cost by avoiding more expensive ArF materials and ArF exposure tools.

The photoresist patterning process flow of the present disclosure enables improved adhesion of sub-100 nm features on a DARC that is SiON or the like. As a result, the CD in a KrF photoresist pattern may be reduced from 100 nm or higher to as low as 60 nm or even 55 nm in some designs. Steps 102-106 described earlier are easy to implement. In particular, there is no need to incorporate additional materials or process modules/stations in the fabrication of sub-100 nm KrF photoresist patterns. The photoresist patterning process flow described herein is not limited to HDD technology, but is also beneficial in reducing cost of ownership in the production of semiconductor devices having CDs below 100 nm. The cost benefit is realized by achieving a larger process latitude within the same exposure system, or by enabling a less expensive (lower cost of ownership) exposure system to replace a more expensive one during production of a certain CD.

While the present disclosure has been particularly shown and described with reference to, the preferred embodiment thereof, it will be understood by those skilled in the art that various changes in form and details may be made without departing from the spirit and scope of this disclosure.

We claim:

1. A method of forming a sub-100 nm critical dimension (CD) in a photoresist pattern on a dielectric anti-reflective coating (DARC) wherein a photoresist layer is patternwise exposed using a KrF (248 nm) exposure tool, comprising:
   (a) depositing the DARC on a substrate;
   (b) treating a top surface of the DARC with a process comprising:
      (1) application of a photoresist developer solution that is an aqueous base; and
      (2) rinsing with deionized (DI) water;
   (c) applying hexamethyl-disilazane (HMDS) to the DARC top surface following step (b);
   (d) coating the photoresist layer on the DARC top surface that has been processed with steps (b) and (c); and
   (e) patternwise exposure of the photoresist layer with the KrF exposure tool.

2. The method of claim 1 wherein the DARC is SiON, SiCOH, or SiN.

3. The method of claim 1 wherein the photoresist developer solution is 0.263 N tetramethylammonium hydroxide (TMAH).

4. The method of claim 1 further comprised of applying a 0.263 N TMAH solution to develop the photoresist pattern in the patternwise exposed photoresist layer.

5. The method of claim 4 wherein the photoresist layer is a positive tone material and unexposed regions in the patternwise exposure thereof remain on the DARC after the 0.263 N TMAH solution is applied to develop the photoresist pattern.

6. The method of claim 1 further comprised of applying the photoresist developer solution to develop the photoresist pattern in the patternwise exposed photoresist layer.

7. The method of claim 6 wherein the photoresist layer is a negative tone material and exposed regions in the patternwise exposure thereof remain on the DARC after the photoresist developer solution is applied to develop the photoresist pattern.

8. The method of claim 7 wherein the photoresist developer solution is comprised of TMAH with a concentration less than 0.263N.

9. The method of claim 1 wherein step (b) comprises a total treatment time of about 30 to 240 seconds in a photoresist developer station.

10. The method of claim 1 wherein the HMDS is applied as a vapor for a period of about 30 to 180 seconds at a temperature in the range of 120° C. to 150° C.

11. A method of improving a process latitude in forming a critical dimension (CD) in a photoresist pattern on a dielectric anti-reflective coating (DARC) wherein the photoresist pattern is patternwise exposed in an optical exposure system, comprising:
   (a) depositing the DARC on a substrate;
   (b) treating a top surface of the DARC with a process comprising:
      (1) application of a first photoresist developer solution that is an aqueous base; and
      (2) rinsing with deionized (DI) water;
   (c) applying hexamethyl-disilazane (HMDS) to the DARC top surface following step (b);
   (d) coating a photoresist layer on the DARC top surface following steps (b) and (c);
   (e) patternwise exposure of the photoresist layer with an exposure tool in the optical exposure system; and
   (f) application of a second photoresist developer solution to form the CD in the photoresist pattern of the patternwise exposed photoresist layer.

12. The method of claim 11 wherein the DARC is SiON, SiCOH, or SiN.

13. The method of claim 11 wherein the first photoresist developer solution is 0.263 N tetramethylammonium hydroxide (TMAH).

14. The method of claim 11 wherein the photoresist layer is patternwise exposed with a KrF exposure tool, an i-line (365 nm) exposure tool, or a 405 nm exposure tool.

15. The method of claim 14 wherein the photoresist layer is a positive tone material and unexposed regions in the patternwise exposure thereof remain on the DARC after the second photoresist developer solution is applied to form the CD.

16. The method of claim 15 wherein the second photoresist developer solution is 0.263 N TMAH.

17. The method of claim 14 wherein the photoresist layer is a negative tone material and exposed regions in the patternwise exposure thereof remain on the DARC after the second photoresist developer solution is applied to form the CD.

18. The method of claim 17 wherein the second photoresist developer solution is comprised of TMAH with a concentration less than 0.263 N.

19. The method of claim 11 wherein step (b) comprises a total treatment time of about 30 to 240 seconds in a photoresist developer station.

20. The method of claim 11 wherein the HMDS is applied as a vapor for a period of about 30 to 180 seconds at a temperature in the range of 120° C. to 150° C.

\* \* \* \* \*